United States Patent [19]

Hsueh et al.

[11] Patent Number: 5,148,061
[45] Date of Patent: Sep. 15, 1992

[54] ECL TO CMOS TRANSLATION AND LATCH LOGIC CIRCUIT

[75] Inventors: Paul Hsueh, Chandler; Douglas Smith, Mesa, both of Ariz.; Gerald B. Hershkowitz, Ramat-Gan, Israel

[73] Assignee: Motorola, Inc., Schaumburg, Ill.

[21] Appl. No.: 661,152

[22] Filed: Feb. 27, 1991

[51] Int. Cl.$^5$ .................. H03K 19/092; H03K 19/096
[52] U.S. Cl. ..................... 307/475; 307/455; 307/451; 307/481
[58] Field of Search ............... 307/451, 475, 455, 480, 307/481

[56] References Cited

U.S. PATENT DOCUMENTS

| | | | |
|---|---|---|---|
| 4,437,171 | 3/1984 | Hudson et al. | 307/475 |
| 4,806,799 | 2/1989 | Pelley, III et al. | 307/475 |
| 4,992,681 | 2/1991 | Urakawa et al. | 307/475 |

Primary Examiner—Edward P. Westin
Assistant Examiner—Richard Roseen
Attorney, Agent, or Firm—Michael D. Bingham

[57] ABSTRACT

A logic circuit that is responsive to applied ECL input logic signals for providing complementary CMOS logic output signals at first and second outputs includes a translation and latch circuit as well as feedback circuitry. The logic circuit includes an input buffer circuit that provides ECL differential logic signals to the translation and latch circuit, the latter of which receives a CMOS clocking pulse. The translation and latch circuit is responsive both to the clocking pulse and the differential ECL logic output signals for producing complementary CMOS control signals at first and second outputs which are latched during the duration of the clocking pulse. A feedback circuit comprising a pair of CMOS inverters each coupled respectively to the first and second outputs of the translation and latch circuit provide feedback control signals which are applied respectively to a pair of CMOS output buffer stages in conjunction with the CMOS control signals to produce the CMOS logic output signals. Between clocking pulses the feedback circuit latches the output signals from the pair of output buffer stages.

15 Claims, 2 Drawing Sheets

ECL TO CMOS TRANSLATION AND LATCH LOGIC CIRCUIT

BACKGROUND OF THE INVENTION

The present invention relates to a logic circuits and, more particularly to an ECL logic signal input register for providing transition to CMOS output level signals.

Electronic circuits referred to as registers are well known in the art for retaining data information at an output between input clocking pulses even though the input data may change between such pulses. A typical application for multiple registers is in memory circuits such as a Random Accessible Memory (RAM) device. The prior art is complete with myriad of such registers implemented in either solely ECL or CMOS technology.

In today's environment, where it is desired to make integrated circuit memory devices more complex while maintaining or increasing speed and decreasing power dissipation on the chip, it has become necessary to combine both the bipolar ECL and CMOS technologies. ECL technology is required to be able to permit the application of relatively low input logic level signals while CMOS technology provides larger output logic level signals.

Therefore a need exists for BICMOS (combined bipolar ECL and CMOS technology) circuit for providing high speed translation between ECL inputs and CMOS outputs.

SUMMARY OF THE INVENTION

Accordingly, an ECL to CMOS logic circuit is provided that has improved signal translation between ECL logic level input signals to CMOS logic level output signals for high speed operation.

The logic circuit is responsive to applied ECL input logic signals for providing CMOS output logic signals and includes an input buffer stage responsive to the ECL input logic signals for providing differential ECL logic output signals; a translation and latch circuit that is responsive both to an applied clock pulse and the differential ECL logic output signals for providing first and second CMOS control signals at first and second outputs thereof and for latching these control signal during the remainder of the applied clock pulse; an inverter circuit which is responsive to the first and second CMOS control signals provides first and second complementary control signals; and output circuitry which is responsive to the first and second CMOS control signals and the first and second control signals to provide first and second complementary CMOS output logic signals at first and second outputs of the logic circuit wherein the inverter circuit latches the CMOS output logic signals to their predetermined logic level states during the absence of the clock pulse applied to the logic circuit.

DETAILED DESCRIPTION OF THE PREFERRED EMBODIMENT

Figure 1:
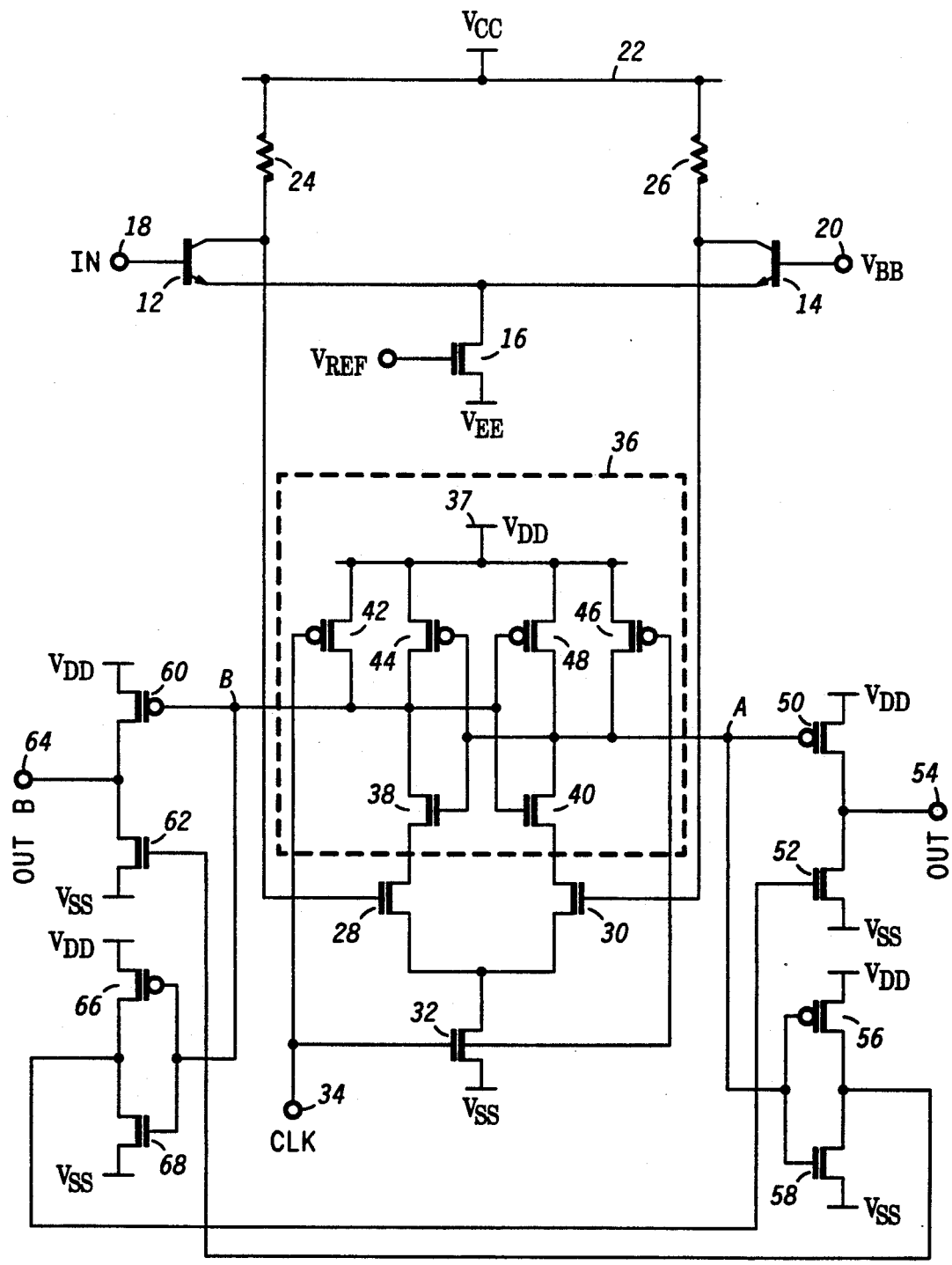
FIG. 1 is a detailed schematic illustrating the ECL to CMOS circuit of the preferred embodiment.

Turning to FIG. 1 there is shown BICMOS input register 10 comprising an ECL input buffer including NPN transistors 12 and 14 which have respective emitters coupled to current source 16. Although current source 16 is shown as consisting of an N-channel FET to which a reference potential Vref is applied to the gate thereof it is understood that any constant current source may be utilized such as a bipolar transistor. Current source 16 sinks a substantially constant current between its drain and source to Vee power supply conductor which current is compositely supplied by transistors 12 and 14 whose emitters are connected to the drain of the N-channel FET. The base of transistor 14 is supplied with a bias potential vbb at terminal 20 the magnitude of which is at a level midway between the ECL logic input signal applied to the base of transistor 12 at terminal 18. The collectors of the two transistors are coupled to Vcc applied to power supply conductor 22 via respective resistors 24 and 26. The operation of the ECL input buffer is conventional in that differential ECL logic signals are produced at the collectors of transistors 12 and 14 responsive to the ECL input signal. Hence, if the ECL input signal applied to terminal 18 is at a low logic level transistor 12 is rendered less conductive than transistor 14 wherein the voltage level at the collector of the latter will be less than the voltage level at the collector of the former. The opposite is true when the ECL input signal is at a high logic level where the voltage at the collector of transistor 12 is less than that at the collector of transistor 14.

The collector outputs of transistors 12 and 14 are respectively coupled to the gates of N-channel FETs 28 and 30 which are part of a voltage translation and latch circuit. The source electrodes of the two FETs are commonly coupled to the drain of current source N-channel FET 32 with the gate of the latter being coupled to clock terminal 34 to which an input clock pulse is applied, the source of the FET is returned to CMOS negative supply. The drains of transistors 28 and 30 are respectively coupled to the sources of N-channel FETs 38 and 40 comprising latch circuit 36. Latch circuit 36 also includes P-channel FETs 42, 44, 46 and 48 the sources of which are returned to Vdd. The drain electrodes of transistors 42 and 44 are both coupled at node B to the drain of transistor 38. Similarly, the drain electrodes of transistors 46 and 48 are both coupled at node A to the drain of transistor 40. The gates of transistors 38 and 44 are coupled to node A while the gates of transistors 40 and 48 are coupled to node B. Likewise, the gates of transistors 42 and 46 are coupled to Clk input terminal 34 to receive the input clock pulses. As will be more fully explained, the aforedescribed translation and latch circuit including latch 36 prevents the output signals from register 10 from switching between the applied clock pulses and translates the ECL differential signals applied to the gates of transistors 28 and 30 to CMOS logic level signals.

Node A is coupled both to the gate of P-channel FET 50, which with N-channel FET 52 comprises an output buffer stage for providing the CMOS output signal at terminal 54, and an input of an inverter comprising P-channel transistor 56 and N-channel FET 58. Node B is coupled both to the gate of P-channel FET 60, which with N-channel FET 62 provides an output buffer stage for providing complementary CMOS output signal, outb, at terminal 64, and an input of an inverter stage comprising P-channel transistor 66 and N-channel FET 68. The sources of transistors 50, 60, 56 and 66 are returned to Vdd while the source electrodes of transistors 52, 58, 62 and 68 are returned to Vss. The drain of transistor 50 is interconnected with the drain of transistor 52 to output 54 while the drain of transistor 60 is interconnected with the drain of transistor 62 to output 64. Feedback is provided from node A to the gate of transistor 62 through the inverter comprising transistors 56 and 58 which have their gates coupled to the node and their interconnected drains coupled to the gate of transistor 62. Similarly, feedback is provided from node B through the inverter comprising transistors 66 and 68 to the gate of transistor 52.

Figure 2:
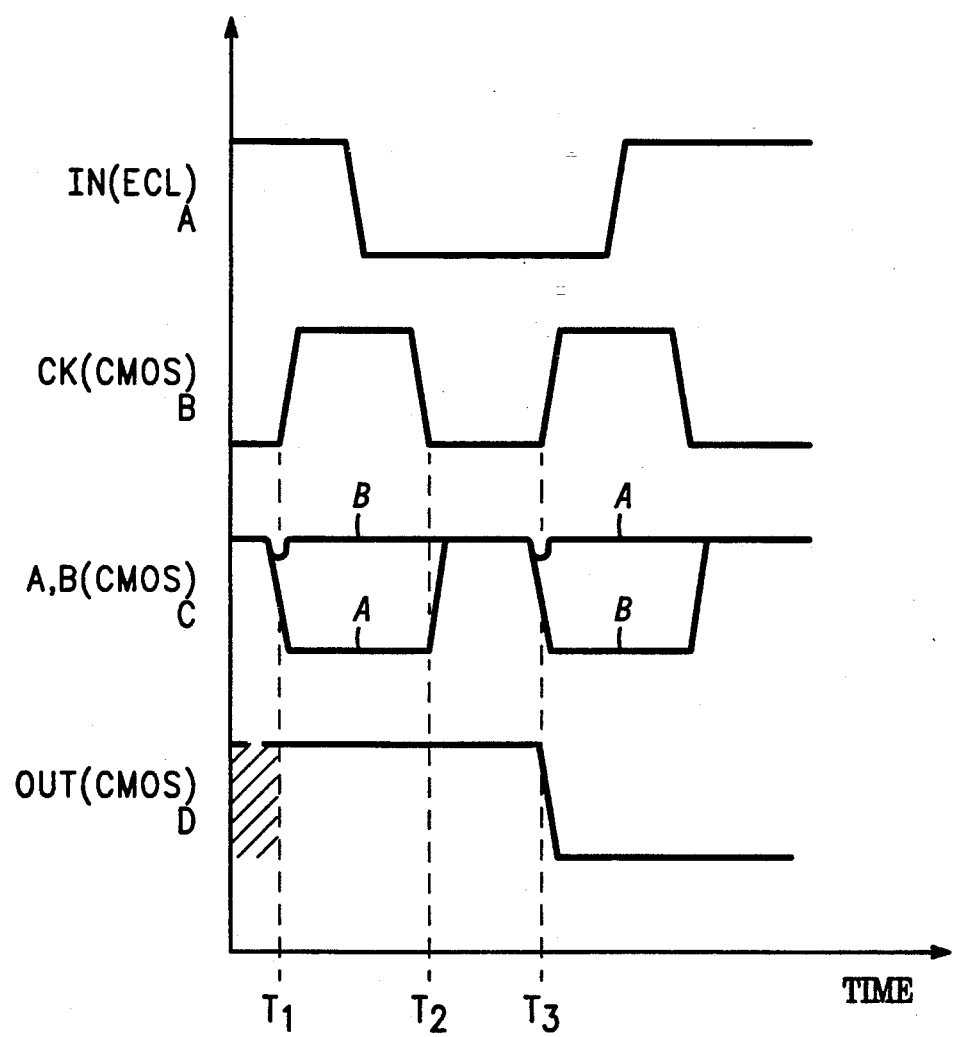
FIG. 2 illustrates waveforms useful for explaining the circuit of FIG. 1.

Referring to the waveforms of FIG. 2, the operation of register 10 can now be fully explained. The assumption is made that prior to time t1, before the application of a clock pulse (waveform 2B), the state of the CMOS output signal at output 54 is unknown as indicated in waveform 2D by the crosshatching. If prior to t1 the ECL input logic signal is high the differential ECL output signals applied to the gates of transistors 28 and 30 are forced low and high respectively. In this state, transistor 30 is biased at a higher potential than transistor 28 and will want to sink more current than transistor 28. Further, since the clock pulse is low transistors 42 and 46 of latch 36 will be on to place both nodes A and B at CMOS logic high levels, waveform 2C. As soon as the clock pulse is applied and rises at time t1, transistor 32 is biased on to sink the current from transistor 28 and 30. Simultaneously, both transistors 42 and 46 begin to turn off in response to the clock pulse and the voltages at nodes A and B begins to drop, FIG. 2B.

Because transistor 30 is biased at a higher potential than transistor 28 transistor 40 is turned on to further pull node A to a low CMOS logic level which causes transistor 38 to then be turned off. As transistor 38 is turned off node B rises back to a high state since the potential applied via transistor 44, which is turned on at this time as node A is at a low level, is nearly at the potential Vdd. This potential at node B causes transistor 48 to turn off. At this time latch 36 is in a latched condition where nodes A and B remain at low and high CMOS logic level states respectively. Thus, in response to an ECL logic input signal a pair of CMOS control signals are produced at nodes A and B. The ECL input signal can now switch without affecting the state of the logic levels appearing at nodes A and B.

As node A is forced to a low logic level transistor 50 is turned on to produce a CMOS high logic level signal at output 54. Simultaneously, node B being at a high logic level turns transistor 60 off which in conjunction with transistor 62 be turned on by the high level feedback signal applied to the gate thereof forces the output signal at terminal 64 to a low CMOS logic level. Transistors 56 and 68 are turned on to provide feedback signals to cause transistors 62 and 52 to be turned on and off respectively thereby ensuring that the output signals at outputs 54 and 64 remain high and low respectively. Hence, the ECL logic input signal has been translated to CMOS logic output level signals. Thus, as long as the clock pulse remains high, node A remains at a low level and changes in the logic state of the ECL input signal does not effect the output logic states at the outputs 54 and 64.

In order to hold the output data at outputs 54 and 64 as the clock pulse is removed feedback is provided. Thus, at time t2, as the clock pulse goes low transistors 42 and 46 are again turned on. This causes nodes A and B to both go high. A high logic level at node A turns on transistor 58 which establishes a low gate bias to transistor 62 ensuring that this transistor remains turned off. Since transistor 60 is already turned off by node B being high the output at terminal 64, outb, remains in a low logic state. Moreover, since the potential at node B is unchanged, transistor 52 remains off and as node A is now high transistor 50 is turned off whereby the logic level at output 54 remains unchanged assuming output 54 is at a high impedance.

Hence, once the logic output states at outputs 54 and 64 are determined in accordance to the state of the ECL input signal at the rising edge of the clock pulse they are latched and are not effected by the ECL input signal switching states. Further, as the clock pulse is removed the logic states of the output signals at output terminals remain unchanged and the data thereat is not lost.

At time t3 in response to the rising edge of the clock pulse, transistors 42 and 46 are once again turned off to allow the potentials at nodes A and B to be determined by transistors 40 and 38 respectively. If, as shown, the ECL input signal has switched to a low logic level transistor 28 will be biased to conduct more current than transistor 30 as transistor 32 is clocked on. Initially, however, both transistors 28 and 30 are turned on to cause the potentials at nodes A and B to begin to decrease as transistors 38 and 40 are conductive. Since transistor 28 is biased on harder, node B is driven to a low level faster than node A whereby transistor 40 is turned off to allow node A to rise back to essentially Vdd as transistor 48 is turned on by the low potential at node B. In this state node A being high turns transistor 50 off and transistor 58 on while transistors 60 and 66 are turned on by node B being low. Hence, transistor 52 is turned on by transistor 66 being on to drive output signal, out, to a low CMOS logic level while transistor 62 is turned off by transistor 58 being biased on to ensure that the output signal, outb, goes high as transistor 60 is on. Thus, the output states of register 10 are switched by the ECL input signal being in a low logic level at the rising edge of the clock pulse at t3. The output states of register 10 remain latched and unchanged after once switching even though the ECL input signal may switch logic states during the remainder of the clock pulse and after removal of the clock pulse in the same manner as aforedescribed.

Hence, what has been described above is a novel integrated logic circuit that provides translation from ECL input logic signals to CMOS output logic signals while latching the outputs of the circuit to predetermined levels after a clock pulse is applied thereto and maintaining these output logic levels between clock pulses. The logic circuit provides high speed ECL-CMOS translation with a latch function by increasing the translation time and saving power consumption to permit the use of the circuit in complex integrated circuits such a static rams.

What is claimed is:

1. A logic circuit for providing translation of input ECL logic signals to CMOS logic output signals, comprising:

input buffer means responsive to applied ECL logic signals for providing differential ECL logic output signals at first and second outputs;

translation and latch circuit means responsive to said differential ECL logic signals and being responsive to clock pulses applied thereto for providing first and second complementary CMOS control signals at respective outputs, said translation and latch circuit means maintaining said first and second CMOS control signals at a predetermined logic level in the absence of said clock pulses;

inverter circuit means responsive to said second CMOS control signal for providing at least one control signal; and at least one output buffer stage responsive to said first CMOS control signal for providing the CMOS logic output signals at a first output of the logic circuit during said clock pulses and being responsive to said at least one control signal for maintaining the particular logic level of the CMOS logic output signals provided at the output of the logic circuit between clock pulses.

2. The logic circuit of claim 16 including:

said inverter circuit means being responsive to said first CMOS control signal for providing an additional control signal; and an additional output buffer stage responsive to said second CMOS control signal for providing CMOS logic output signals at a second output of the circuit wherein said CMOS logic output signals appearing at said second output are the complements of said CMOS logic output signals appearing at said first output of the circuit, said additional output buffer stage being responsive to said additional control signal for maintaining the particular logic level of the CMOS logic output signals at said second output of the circuit.

3. The logic circuit of claim 2 wherein said translation and latch circuit means includes:

a translation circuit comprising a first and a second field effect transistor (FET) of like conductivity type each having a gate, source and drain, said gates of said first and second FETs being coupled to said first and second outputs of said input buffer means respectively, said drains being coupled respectively to said first second and first outputs of said translation and latch circuit means; and current means coupled to said to said sources of said first and second FETs and being responsive to said clock pulses applied at an input thereto for sinking a substantially constant current.

4. The logic circuit of claim 3 wherein said translation and latch circuit means includes a latch circuit, said latch circuit comprising:

a third FET of like conductivity type as said first FET and having a gate, drain and source, said source being coupled to said drain of said first FET, said drain being coupled to said second output and said gate being coupled to said first output;

a fourth FET of like conductivity type as said second FET and having a gate, drain and source, said source being coupled to said drain of said second FET, said drain being coupled to said first output and said gate being coupled to said second output;

a fifth and sixth FET of a second conductivity type each having a gate, drain and source, said sources being coupled to said second output and said drains being coupled to a first power supply conductor, said gate of said fifth FET being coupled to said input to which said clock pulse is applied and said gate of said sixth FET being coupled to said first output; and a seventh and eighth FET of second conductivity type each having a gate, drain and source, said sources being coupled to said first output, said drains being coupled to said first power supply conductor, said gate of said seventh FET being coupled to said input to which said clock pulse is applied and said gate of said eighth FET being coupled to said second output.

5. The logic circuit of claim 4 wherein said at least one output buffer stage includes:

a ninth FET of said second conductivity type having a gate, drain and source, said gate being coupled to said first output of the translation and latch circuit means, said drain being coupled to said first power supply conductor and said source being coupled to said first output of the circuit; and a tenth FET of said first conductivity type having a gate, drain and source, said gate being coupled to said inverter circuit means for receiving said at least one control signal, said drain being coupled to said first output of the circuit and said source being coupled to a second power supply conductor.

6. The logic circuit of claim 5 wherein said additional output buffer stage includes:

an eleventh FET of said second conductivity type having a gate, drain and source, said gate being coupled to said second output of the translation and latch circuit means, said drain being coupled to said first power supply conductor and said source being coupled to said second output of the circuit; and a twelfth FET of said first conductivity type having a gate, drain and source, said gate being coupled to said inverter circuit means for receiving said additional control signal, said drain being coupled to said second output of the circuit and said source being coupled to said second power supply conductor.

7. The logic circuit of claim 6 wherein said inverter circuit means includes:

a first inverter having an input coupled to said second output of the translation and latch circuit means and an output, said first inverter being responsive to said second CMOS control signal for providing said at least one control signal at said output thereof; and a second inverter having an input coupled to said first output of said translation and latch circuit means and an output, said second inverter being responsive to said first CMOS control signal for providing said additional control signal at said output thereof.

8. An integrated logic circuit responsive to applied ECL input logic signals for providing CMOS output logic signals, comprising:

input buffer means responsive to the ECL input logic signals for providing differential ECL logic output signals;

circuit means responsive both to applied clock pulses and said differential ECL logic output signals for providing first and second CMOS control signals at first and second outputs thereof and for latching said first and second CMOS control signals to a predetermined logic level between said applied pulses;

inverter circuit means responsive to said first and second CMOS control signals for providing first and second complementary control signals; and output circuit means responsive to said first and second CMOS control signals and said first and second control signals for providing complementary CMOS output logic signals at first and second outputs of the logic circuit, said inverter circuit means causing said CMOS output logic signals to be latched at their predetermined logic level states during the absence of said clock pulses applied to the logic circuit.

9. The logic circuit of claim 8 wherein said circuit means includes:
   a translation circuit responsive to said differential ECL logic output signals and said clock pulse for providing first and second differential currents at first and second outputs thereof; and
   a latch circuit coupled to said first and second outputs of said translation circuit and receiving said clock pulse for providing said CMOS control signals and latching the same to their predetermined levels during the duration of said clock pulse.

10. The logic circuit of claim 9 wherein said output circuit means includes:
    a first output buffer stage having first and second inputs and an output, said first input being coupled to said first output of said circuit means, said second input being coupled to a first output of said feedback circuit means at which is provided said first control signal and said output being coupled to said first output of the logic circuit; and
    a second output buffer stage having first and second inputs and an output, said first input being coupled to said second output of said circuit means, said second input being coupled to a second output of said feedback circuit means at which is provided said second control signal and said output being coupled to said second output of the logic circuit.

11. The logic circuit of claim 10 wherein said inverter circuit means includes:
    a first inverter having an input and an output, said input being coupled to said second output of said circuit means and said output being said first output of said inverter circuit means; and
    a second inverter having an input and an output, said input being coupled to said first output of said circuit means and said output being said second output of said inverter circuit means.

12. An integrated memory circuit including an ECL input logic signal to CMOS output logic translation and latch circuit wherein said translation and latch circuit comprises:
    input buffer means responsive to ECL input logic signals for providing differential ECL logic output signals;
    circuit means responsive both to applied clock pulses and said differential ECL logic output signals for providing first and second CMOS control signals at first and second outputs thereof and for latching said CMOS control signals to a predetermined logic level during the absence of said applied clock pulses;
    inverter circuit means responsive to said first and second CMOS control signals for providing first and second complementary control signals; and
    output circuit means responsive to said first and second CMOS control signals and said first and second control signals for providing first and second complementary CMOS output logic signals at first and second outputs of the translation and latch circuit, said inverter circuit means causing said CMOS output logic signals to be latched at their predetermined logic level states between said applied pulses.

13. The memory circuit of claim 12 wherein said circuit means includes:
    a translation circuit responsive to said differential ECL logic output signals and said clock pulse for providing first and second differential currents at first and second outputs thereof; and
    a latch circuit coupled to said first and second outputs of said translation circuit and receiving said clock pulse for providing said CMOS control signals and latching the same to their predetermined levels during the duration of said clock pulse.

14. The memory circuit of claim 13 wherein said output circuit means includes:
    a first output buffer stage having first and second inputs and an output, said first input being coupled to said first output of said circuit means, said second input being coupled to a first output of said inverter circuit means at which is provided said first control signal and said output being coupled to said first output of the translation and latch circuit; and
    a second output buffer stage having first and second inputs and an output, said first input being coupled to said second output of said circuit means, said second input being coupled to a second output of said inverter circuit means at which is provided said second control signal and said output being coupled to said second output of the translation and latch circuit.

15. The memory circuit of claim 14 wherein said inverter circuit means includes:
    a first inverter having an input and an output, said input being coupled to said second output of said circuit means and said output being said first output of said inverter circuit means; and
    a second inverter having an input and an output, said input being coupled to said first output of said circuit means and said output being said second output of said inverter circuit means.

* * * * *